United States Patent
Lu et al.

(10) Patent No.: US 6,471,831 B2
(45) Date of Patent: *Oct. 29, 2002

(54) APPARATUS AND METHOD FOR IMPROVING FILM UNIFORMITY IN A PHYSICAL VAPOR DEPOSITION SYSTEM

(75) Inventors: Jean Qing Lu, Palo Alto, CA (US); Tom Yu, San Leandro, CA (US); Linda Stenzel, Mt. Hermon, CA (US); Jeffrey Tobin, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/757,552

(22) Filed: Jan. 9, 2001

(65) Prior Publication Data

US 2002/0088711 A1 Jul. 11, 2002

(51) Int. Cl.$^7$ ............................................. C23C 14/35
(52) U.S. Cl. ......................... 204/192.12; 204/298.12; 204/298.14; 204/298.16; 204/298.17; 204/298.18; 204/298.2; 204/298.21; 204/298.22; 204/298.11
(58) Field of Search ........................ 204/298.12, 298.14, 204/298.16, 298.17, 298.18, 298.19, 298.2, 298.21, 298.22, 192.12, 298.11

(56) References Cited

U.S. PATENT DOCUMENTS

| | | | |
|---|---|---|---|
| 4,060,470 A | * 11/1977 | Clarke | ................... 204/298.12 |
| 4,622,121 A | 11/1986 | Wegmann et al. | |
| 4,865,712 A | 9/1989 | Mintz | |
| 5,171,415 A | 12/1992 | Miller et al. | |
| 5,188,717 A | 2/1993 | Broadbent et al. | |
| 5,198,725 A | * 3/1993 | Chen et al. | ............. 315/111.41 |
| 5,208,512 A | * 5/1993 | Forster et al. | ........... 315/111.41 |
| 5,252,194 A | 10/1993 | Demaray et al. | |
| 5,334,302 A | * 8/1994 | Kubo et al. | ............. 204/298.18 |
| 5,482,611 A | 1/1996 | Helmer et al. | |
| 5,593,551 A | 1/1997 | Lai | |
| 5,688,382 A | * 11/1997 | Besen et al. | ........... 204/192.12 |
| 6,013,159 A | * 1/2000 | Adams et al. | .......... 204/192.12 |
| 6,179,973 B1 | * 1/2001 | Lai et al. | ................ 204/192.12 |
| 6,193,854 B1 | * 2/2001 | Lai et al. | ................ 204/192.12 |
| 6,217,716 B1 | * 4/2001 | Fai Lai | ................... 204/298.12 |

* cited by examiner

*Primary Examiner*—Rodney G. McDonald
(74) *Attorney, Agent, or Firm*—Okamoto & Benedicto LLP

(57) ABSTRACT

A PVD system comprises a hollow cathode magnetron with a downstream plasma control mechanism. The magnetron has a hollow cathode with a non-planar target and at least one electromagnetic coil to generate and maintain a plasma within the cathode. The magnetron also has an anode located between the cathode and a downstream plasma control mechanism. The control mechanism comprises a first, second and third electromagnetic coil beneath a mouth of the target, vertically spaced so as to form a tapered magnetic convergent lens between the target mouth and a pedestal of the magnetron.

20 Claims, 5 Drawing Sheets

APPARATUS AND METHOD FOR IMPROVING FILM UNIFORMITY IN A PHYSICAL VAPOR DEPOSITION SYSTEM

BACKGROUND OF THE INVENTION

1. Field of the Invention

This invention relates generally to Physical Vapor Deposition ("PVD") systems, and more particularly to an apparatus and method for improving film uniformity in a PVD system.

2. Description of the Background Art

Physical vapor deposition ("PVD") is a well known technique for depositing metal layers onto semiconductor wafers (also referred to herein as "substrates"). These thin metal layers can be used as diffusion barriers, adhesion or seed layers, primary conductors, antireflection coatings, and etch stops, etc.

In a conventional Hollow Cathode Magnetron ("HCM"), magnetic fields are used to generate a high density plasma of Argon ("Ar") or other suitable inert gas and target material within a cathode of the HCM. The magnetic fields are also used to confine the plasma within the HCM. The cathode also has a target, such as Tantalum ("Ta"), Aluminum ("Al"), Titanium ("Ti"), or other suitable metal. A power pin supplies a negative potential to the target such that the magnetic fields in combination with the negative potential cause plasma ions to hit the target with high energy, which in turn cause target atoms to dislodge from the surface of the target by direct momentum transfer and also create secondary electrons. These dislodged atoms and ions (created by the secondary electrons) are then deposited on the semiconductor wafer.

To decrease the cost of manufacturing, the semiconductor device industry is migrating from 200 mm wafers to 300 mm wafers. However, this increase in wafer size brings with it associated problems relating to film uniformity. Specifically, PVD systems that may be suitable for 200 mm wafers significantly increase edge roll-off when used to process 300 mm wafers, such that on average the film deposition is 10% thicker at the center of the substrate than at the edges. In addition, Rs uniformity, film thickness uniformity and step coverage uniformity are also decreased significantly with the 300 mm substrate.

Accordingly, a PVD system that can be used to perform PVD on varying wafer sizes, including 300 mm wafers, is highly desirable.

SUMMARY

The present invention provides an apparatus for improving film uniformity in a PVD system. In one embodiment, the apparatus comprises a plasma downstream control mechanism for use in a HCM. The plasma downstream control mechanism comprises three EM coils in the HCM. The three coils are spread between the HCM target mouth and the pedestal, on which the substrate is located. In one embodiment, the top coil has the strongest amp-turn and middle and lowest coils have successively decreasing amp-turns. These three coils form a convergent tapered magnetic lens, which gradually confines the plasma leading to more uniform target ion and neutral distributions. This, in turn, leads to a more uniform vapor deposition on the substrate with improved Rs uniformity, film thickness uniformity and step coverage uniformity across a wafer substrate.

The present invention further provides a method for improving plasma and film uniformity in a PVD system. The method uses the apparatus described above and comprises the steps of maintaining a plasma within the cathode of the HCM and using the plasma downstream control mechanism to control the flow of ionized target atoms onto the wafer substrate.

The system and method may advantageously perform PVD onto a wafer substrate, including 300 mm wafers, yielding an improved Rs uniformity, film thickness uniformity and step coverage uniformity as compared to a conventional PVD system.

DETAILED DESCRIPTION OF THE PREFERRED EMBODIMENT

The following description is provided to enable any person skilled in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
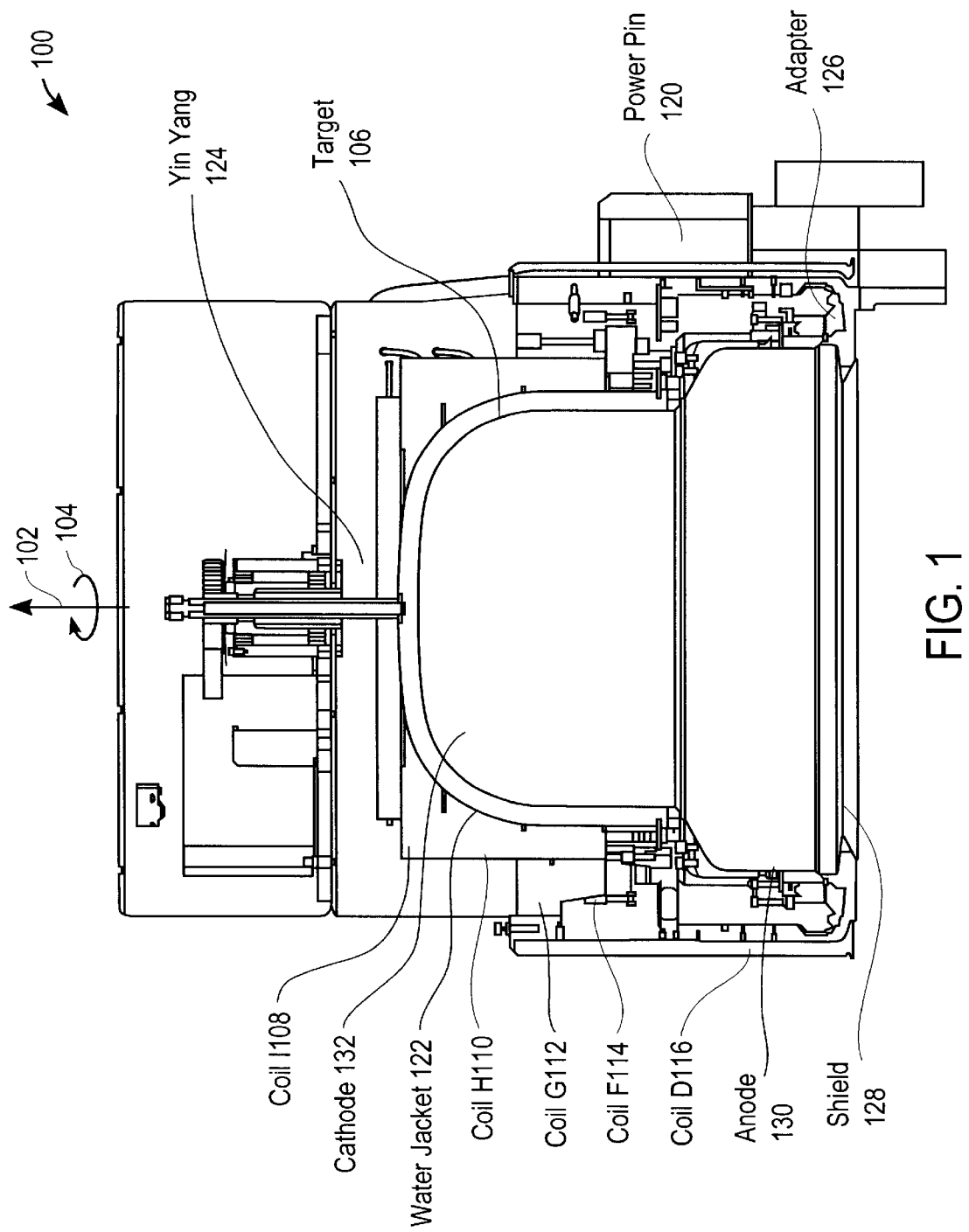
FIG. 1 shows a cutaway view of a HCM source according to an embodiment of the present invention.

FIG. 1 shows a cutaway view of a HCM source 100 according to an embodiment of the present invention. The HCM source 100 is symmetrical in shape around axis 102 as indicated by arrow 104. HCM source 100 has a cathode 132, wherein the plasma is generated, and an electrically floating anode 130 located beneath the mouth of target 106. Target 106 is composed of tantalum ("Ta"), which is biased to about −300 to −400 volts using voltage from power pin 120, which has a source power of 25 kW and current of 71 Amps. In an alternative embodiment of the present invention, the target 106 is composed of titanium or other suitable material. Cathode 132 and target 106 can be of any hollow non-planar or planar shape. Other HCM sources, such as those disclosed in commonly owned U.S. patent application Ser. No. 09/345,466 entitled "Apparatus and Method for Controlling Plasma Uniformity Across a Substrate" filed Jun. 30, 1999, now U.S. Pat. No. 6,179 973 and U.S. patent application Ser. No. 09/653,611 pending entitled "Aparatus and Method for Controlling Plasma Uniformity Across a Substrate" filed Aug. 31, 2000, may also be used. The just-mentioned applications are incorporated herein by reference in their entirety.

Argon or another suitable inert gas that cannot react with the target 106 is injected into HCM source 100 by an injector (not shown) at a flow rate of 9 standard cubic centimeters per minute ("sccm"). Pressure within the HCM is generally maintained at about 0.5 mTorr. HCM source 100 also comprises coil I 108, coil H 110, coil G 112, and coil F 114, which, in concert, generate a magnetic field that creates a plasma from the Argon gas within the HCM source 100. The plasma created is a high-density plasma on the order of $10^{13}$ cm$^3$. Due to the negative potential of the target 106, ions from the plasma impact the tantalum target 106 causing Ta atoms to sputter off of the surface of the target 106 due to direct momentum transfer. The Ta atoms become ionized and, as they travel downstream in the HCM 350 (FIG. 3), plasma downstream control mechanism 300 (FIG. 3) directs the ionized Ta atoms to a wafer or substrate (not shown). Ionization and the plasma downstream control mechanism 300 will be discussed in further detail in conjunction with FIG. 3–FIG. 5.

In one embodiment, the coils used to generate and confine the plasma have strengths as follows: coil I 108 has a coil strength of 1,576.8 amp-turn; coil H 110 has a coil strength of 1,016.6 amp-turn; coil G 112 has a coil strength of 600.6 amp-turn; and coil F 114 has a coil strength of 415.8 amp-turn. Coil D 116 is part of the plasma downstream control mechanism, which will be discussed in further detail in conjunction with FIG. 3. While the embodiment of the HCM source 100 described above has four coils, any number of coils can be used as long as the plasma can be generated and maintained within the cathode 132. Alternatively, permanent magnets may be used in place of electromagnetic ("EM") coils to maintain the plasma.

Figure 2:
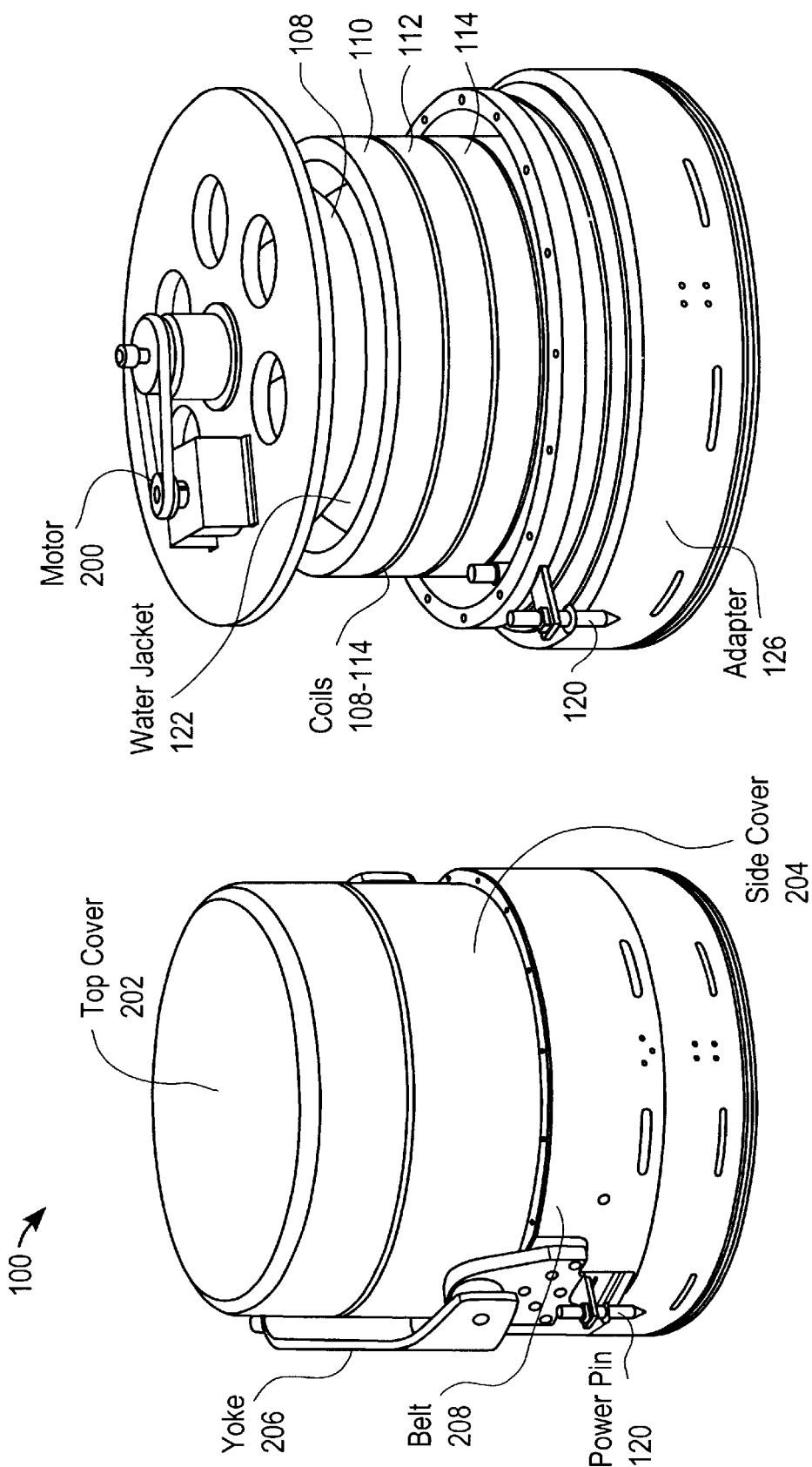
FIG. 2a and FIG. 2b show the exterior of the HCM source of FIG. 1.

Other features of the HCM source 100 include a water jacket 122, which cools the target 106; adapter 126, which supports the HCM source 100; and shield 128, which blocks any magnetic flux leaking out from the HCM source 100, so as to reduce interference between two adjacent HCM sources. HCM source 100 also includes yin yang 124, which is a rotating permanent magnet spun by motor 200 (FIG. 2*b*). Yin yang 124 causes the plasma to sputter target material from the top of target 106 to ensure uniform target sputtering and erosion.

FIG. 2*a* shows the exterior of HCM 100, which includes top cover 202; side cover 204; yoke 206; and belt 208. Also shown is the power pin 120 of FIG. 1. Top cover 202, side cover 204, and belt 208 can be removed to allow access to the coils I 108, H 110, G 112, and F 114 as well as the target 106.

FIG. 2*b* shows the exterior of HCM 100 with the top cover 202, side cover 204, and belt 208 removed. Visible in FIG. 2*b* are coils I 108, H 110, G 112, and F 114; waterjacket 122; and adapter 126. Also shown is motor 200, which spins yin yang 124 (FIG. 1).

Figure 3:
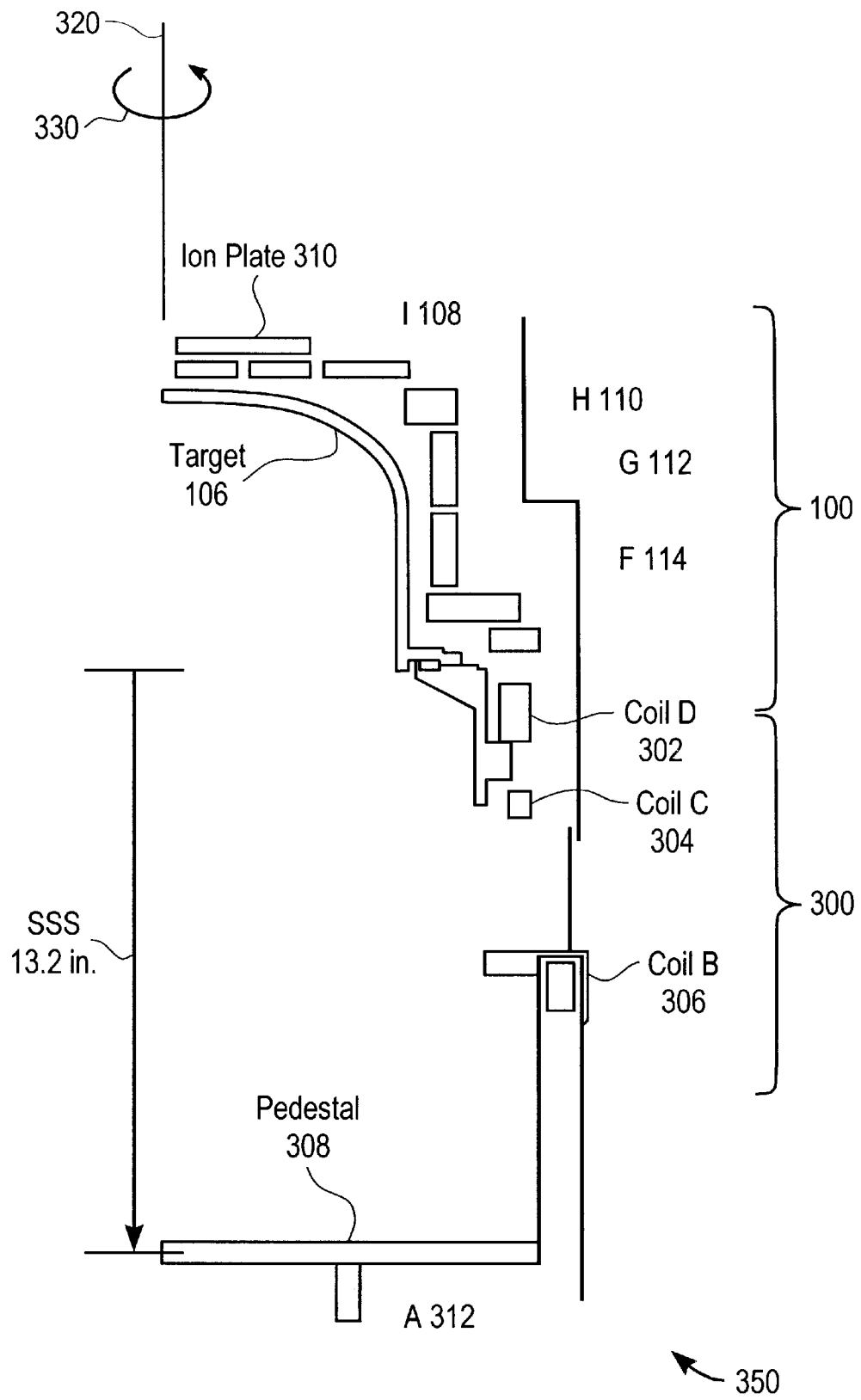
FIG. 3 shows a schematic diagram of a PVD system including the HCM source of FIG. 1 and a plasma downstream control mechanism according to an embodiment of the present invention.

FIG. 3 shows a schematic diagram of a PVD system including the HCM source 100 and a plasma downstream control mechanism 300 according to an embodiment of the present invention. The HCM source 100 and plasma downstream control mechanism 300 are symmetrical about axis 320 as indicated by arrow 330. As discussed in FIG. 1, this view of HCM source 100 includes target 106, and EM coils H 110, G 112, F 114, and I 108. HCM 350 also comprises pedestal 308 on which the substrate or wafer is placed for PVD. The HCM source 160 to substrate spacing ("SSS") is 13.2 inches.

In one embodiment, plasma downstream control mechanism 300 comprises three EM coils: coil D 302, coil C 304, and coil C 306. The three coils are symmetrical about axis 320 and form a tapered magnetic convergent lens. The three coils are spaced between the HCM target 106 mouth and the pedestal 308. The topmost coil, coil D 302, is the strongest and has a strength of 552 amp-turn. Coil D 302 is located 12.4 inches from the pedestal 308. Coil C 304 is weaker than coil D 302 and has a strength of 261 amp-turn. Coil C 304 is located 10.2 inches from the pedestal 308. Coil B 306 is the weakest of the three coils and has a strength of 194 amp-turn. Coil B 306 is located 6 inches from the pedestal 308.

Coils D 302, C 304, B 306, in combination, act as a tapered magnetic lens that gradually confines the plasma, thereby causing the both the Ta ion and neutral distributions to be more uniform. This in turn leads to a more uniform deposition of sputtered Ta atoms onto the 300 mm substrate resting on pedestal 308 with improved Rs uniformity, film thickness uniformity, and step coverage uniformity. In alternative embodiments, substrates larger or smaller than 300 mm can be used. For example, an embodiment can be used for physical vapor deposition onto a 200 mm substrate or a 450 mm substrate.

Figure 4:
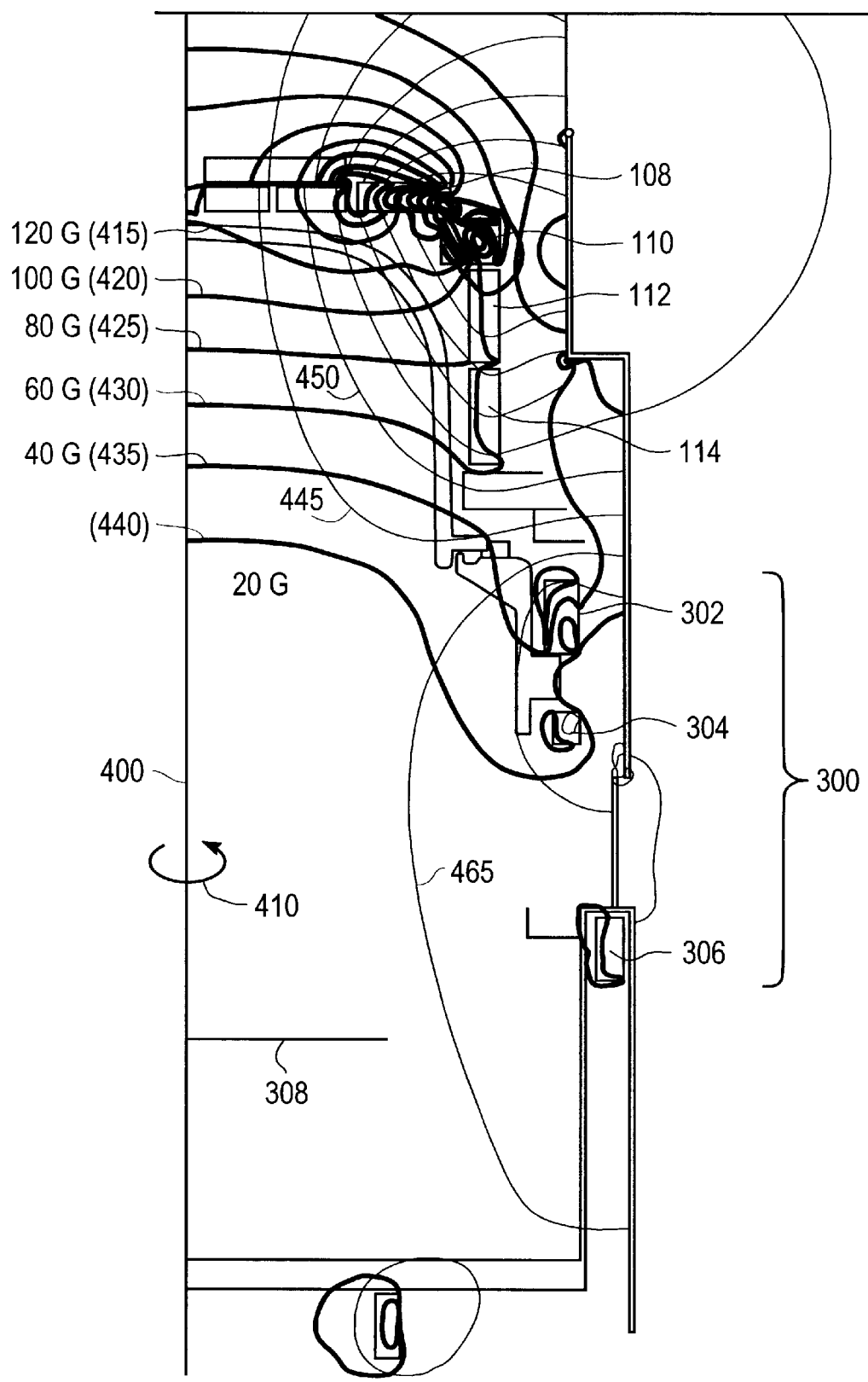
FIG. 4 shows a magnetostatic simulation plot for the PVD system of FIG. 3.

FIG. 4 shows a magnetostatic simulation plot for the cross section of HCM source 100 and plasma downstream control mechanism 300. The HCM source 100 and plasma downstream control mechanism 300 are symmetrical about axis 400 as indicated by arrow 410. Coils I 108, H 110, G 112, and F 114 are used to generate magnetic field lines 415, 420, 425, 430, 435, and 440. The strength of the field lines 415, 420, 425, 430, 435, and 440 are as indicated in FIG. 4 but can be varied by modifying the current flow in the coils I 108, H 110, G 112, and F 114. Alternatively, coils I 108, H 110, G 112, and F 114 may be permanent magnets, in which case, field lines 415, 420, 425, 430, 435, and 440 cannot be varied. Magnetic field lines 415, 420, 425, 430, 435, and 440 are aligned in the radial or R direction and are used to generate a plasma from the injected inert gas. In addition, magnetic field lines 415, 420, 425, 430, 435, and 440 cause ions from the plasma to impact the sidewalls of the target 106. Upon impact, the plasma ions cause target atoms to dislodge from the target 106 due to direct momentum transfer. The impact also forms secondary electrons, which ionize a fraction of the dislodged target atoms.

Coils I 108, H 110, G 112, and F 114 also generate, in conjunction with yin yang 124 and the negative potential of the target 106, magnetic field lines in the axial or Z direction. Specifically, coils I 108, H 110, G 112, and F 114, in conjunction with yin yang 124, generate field lines 445, 450. These field lines also generate plasma and cause plasma ions to impact the top of target 106, thereby enhancing the erosion profile of target 106.

As discussed in conjunction with FIG. 3, plasma downstream control mechanism 300 consists of electromagnetic coils D 302, C 304, and B 306. The coils of plasma downstream control mechanism 300 generate a convergent tapered magnetic lens as shown by magnetic field line 465, which extends in the axial or Z direction. Of course, any number of magnets or EM coils may be located between the substrate and the target mouth to form the convergent tapered magnetic lens.

As in-flight ionized target atoms pass through the convergent tapered magnetic lens, the ions become more uniformly distributed. Further, by varying the current in the coils of the downstream plasma control mechanism, the magnetic field line 465 can vary inward or outward along the radial or R direction to further control the path of the ionized target atoms. After the ionized target atoms pass through the convergent tapered magnetic lens, the ionized atoms impact the substrate on pedestal 308 thereby creating a film with good film deposition uniformity.

Figure 5:
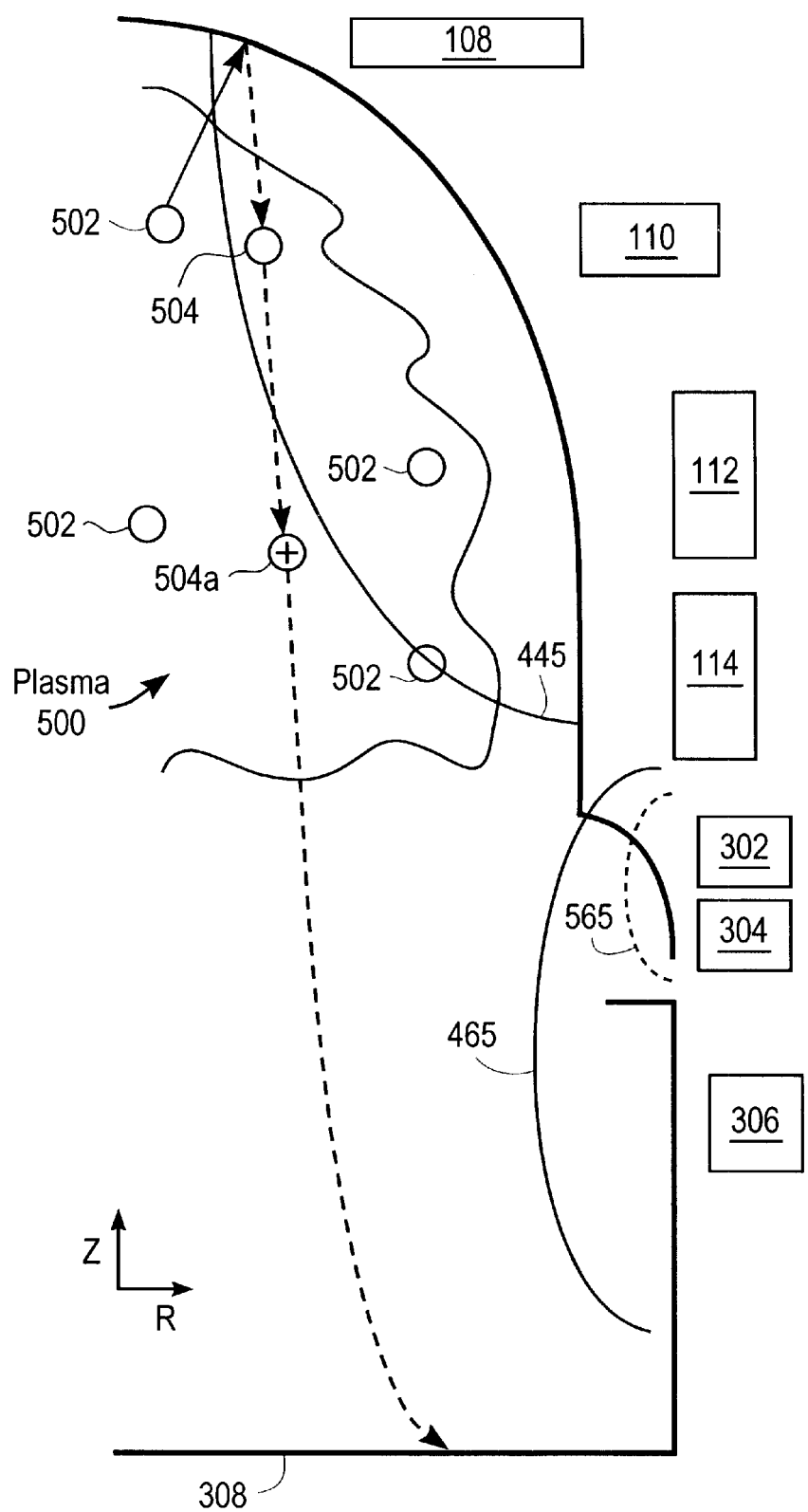
FIG. 5 shows the trajectory of target atoms in the PVD system of FIG. 3.

FIG. 5 shows the trajectory of target atoms in the PVD system 350. The PVD system 350 directs the trajectory of ionized target atoms from a high density plasma in the source 100 towards the substrate. Electromagnetic coils I 108, H 110, G 112, and F 114 generate plasma 500 from Argon gas. Plasma 500 comprises ions 502. Plasma ions 502 strike the target 106 and dislodge target atoms 504 via direct momentum transfer. The impact also causes the formation of secondary electrons (not shown).

Once a target atom 504 is dislodged from the target 106, the atom 504 enters the plasma 500 where it may collide with one or more secondary electrons. As the target atom 504 passes through the plasma 500, electron bombardment, by the secondary electrons, of the target atom 504 causes the target atom 504 to ionize into positively charged target ion 504a. Target ion 504a continues through the plasma 500 and exits, heading downstream. Target ion 504a then passes through plasma downstream control mechanism 300 and gets shifted in the radial direction in parallel to magnetic flux line 465. Target ion 504a then strikes the substrate on pedestal 308, thereby adding to a film of target 106 material on the substrate.

Due to the plasma downstream control mechanism 300, target ions are more even distributed onto the substrate. In comparison, using a conventional plasma downstream control mechanism generating magnetic field line 565, the target ion 504a cannot be directed as much in the radial direction, thereby leading to an increase in edge roll-off and a decrease in Rs uniformity, film thickness uniformity and step coverage uniformity.

The foregoing description of the preferred embodiment of the present invention is by way of example only, and other variations and modifications of the above-described embodiments and methods are possible in light of the foregoing teaching. For example, target 106 may be comprised of titanium instead of tantalum. Further, the number, type and shape of components or magnetic materials shown can be varied to achieve the same effect as that disclosed herein. The present invention is limited only by the following claims.

What is claimed is:

1. A hollow cathode magnetron, comprising:
   a hollow cathode, the cathode including a target and at least one magnet to generate and maintain a high density plasma;
   an anode located beneath the cathode;
   a plurality of magnets downstream from beneath a mouth of the target positioned so as to form a tapered magnetic convergent lens between the cathode and a pedestal.

2. The hollow cathode magnetron of claim 1, wherein the plurality of magnets comprise a first, second, and third electromagnetic coils.

3. The hollow cathode magnetron of claim 1, wherein the plurality of magnets are vertically spaced between the target mouth and the pedestal.

4. The hollow cathode magnetron of claim 1, wherein the target comprises tantalum.

5. The hollow cathode magnetron of claim 1, wherein the anode is electrically floating.

6. The hollow cathode magnetron of claim 2, wherein the first electromagnetic coil has a higher amp-turn than the second electromagnetic coil and wherein the second electromagnetic coil has a higher amp-turn than the third electromagnetic coil.

7. The hollow cathode magnetron of claim 2, wherein the first, second, and third electromagnetic coils can modulate magnetic fields to gradually confine ionized target atoms towards the pedestal.

8. The hollow cathode magnetron of claim 1, wherein the at least one magnet comprises four electromagnetic coils.

9. The hollow cathode magnetron of claim 1, wherein a substrate on the pedestal is 300 mm.

10. The hollow cathode magnetron of claim 1, further comprising a shield to prevent magnetic flux from leaking out of the hollow cathode magnetron.

11. A plasma downstream control mechanism, comprising:
    a plurality of magnets disposed downstream from a mouth of a hollow cathode configured to provide high density plasma; and
    wherein magnets in the plurality of magnets are vertically positioned so as to form a convergent magnetic lens.

12. The plasma downstream control mechanism of claim 11, wherein the plurality of magnets comprises:
    a top electromagnetic coil;
    a middle electromagnetic coil having an amp-turn less than the top electromagnetic coil; and
    a bottom electromagnetic coil, the bottom electromagnetic coil having an amp-turn less than the middle electromagnetic coil.

13. The plasma downstream control mechanism of claim 11, wherein the plasma downstream control mechanism is used in a hollow cathode magnetron.

14. The plasma downstream control mechanism of claim 12, wherein the top, middle, and bottom electromagnetic coils are configured to modulate magnetic fields to gradually confine ionized target atoms towards a substrate.

15. The plasma downstream control mechanism of claim 14, wherein the substrate is substantially 300 mm in diameter.

16. A method of magnetron sputtering, comprising:
    generating a high density plasma within a cathode of a hollow cathode magnetron;
    using the plasma to sputter atoms from a target in the hollow cathode magnetron; and
    forming a tapered magnetic convergent lens between a mouth of the hollow cathode magnetron and a substrate using a plurality of magnets downstream from a mouth of the hollow cathode magnetron.

17. The method of claim 16, wherein the plurality of magnets comprises:
    a top electromagnetic coil;
    a middle electromagnetic coil having an amp-turn less than the top electromagnetic coil;
    a bottom electromagnetic coil, the bottom electromagnetic coil having an amp-turn less than the middle electromagnetic coil; and wherein
    the top, middle, and bottom electromagnetic coils are vertically positioned so as to form a convergent tapered magnetic lens.

18. The method of claim 16, further comprising the act of maintaining the plasma within the cathode.

19. The method of claim 16, wherein the substrate is substantially 300 mm in diameter.

20. The method of claim 17, wherein the top coil, middle coil, and bottom coil can modulate magnetic fields to gradually confine ionized target atoms.

* * * * *